(12) United States Patent
Song (10) Patent No.: US 7,184,912 B2
(45) Date of Patent: Feb. 27, 2007

(54) MEMORY DEVICE WITH APPARATUS FOR RECALIBRATING OUTPUT SIGNAL OF INTERNAL CIRCUIT AND METHOD THEREOF

(75) Inventor: Ho Uk Song, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 11/111,290

(22) Filed: Apr. 21, 2005

(65) Prior Publication Data

US 2006/0173643 A1      Aug. 3, 2006

(30) Foreign Application Priority Data

Jan. 31, 2005   (KR) .................... 10-2005-0008525

(51) Int. Cl.
*G01R 35/00* (2006.01)
*H03K 19/003* (2006.01)

(52) U.S. Cl. ...................................... 702/107
(58) Field of Classification Search ............... 702/107
See application file for complete search history.

(56) References Cited

U.S. PATENT DOCUMENTS 7,019,556 B2 *    3/2006   Yoo ........................... 326/30

* cited by examiner

*Primary Examiner*—Michael Nghiem
*Assistant Examiner*—Cindy D. Khuu
(74) *Attorney, Agent, or Firm*—Ladas & Parry LLP

(57) ABSTRACT

A memory device with an apparatus for recalibrating an output signal of an internal circuit is disclosed. The memory device includes a plurality of signal modulators for simultaneously receiving the output signal of the internal circuit, and a control unit for outputting a control signal for selecting one of the plurality of signal modulators. The control signal output from the control unit includes OCD (Off Chip Driver) calibration information.

6 Claims, 7 Drawing Sheets

FAST SKEW

TYPICAL SKEW

SLOW SKEW

MEMORY DEVICE WITH APPARATUS FOR RECALIBRATING OUTPUT SIGNAL OF INTERNAL CIRCUIT AND METHOD THEREOF

BACKGROUND OF THE INVENTION

1. Field of the Invention

The present invention relates to an apparatus for controlling the pulse width of an internal control signal used in a memory device using OCD (Off Chip Driver) calibration information, and a method thereof.

2. Description of the Prior Art

Recent high-integration and high-speed memory devices may differ greatly in performance according to their process variation. Particularly, output drives of the memory device that transmit data to an external system may differ greatly in driving force according to their process variation. Accordingly, from a DDR2 sync memory device, the driving capability of the output drive of the memory device is calibrated using OCD calibration information.

As is well known, the OCD calibration means that the external system checks the driving force of the output driver of the memory device caused by the process variation and calibrates the driving force of the output driver. Also, the OCD calibration information means the process skew information of the memory device that the external system obtains from the OCD calibration. Here, the process skew means the characteristic deviation of the respective element of circuit due to the process variation.

However, the conventional OCD calibration information has been used only to calibrate the driving force of the output driver of the memory device, and this causes internal circuits of the memory device to include the process skew according to the process variation. Hereinafter, the problems involved in the conventional memory device will be explained with reference to the accompanying drawings.

Figure 1A:
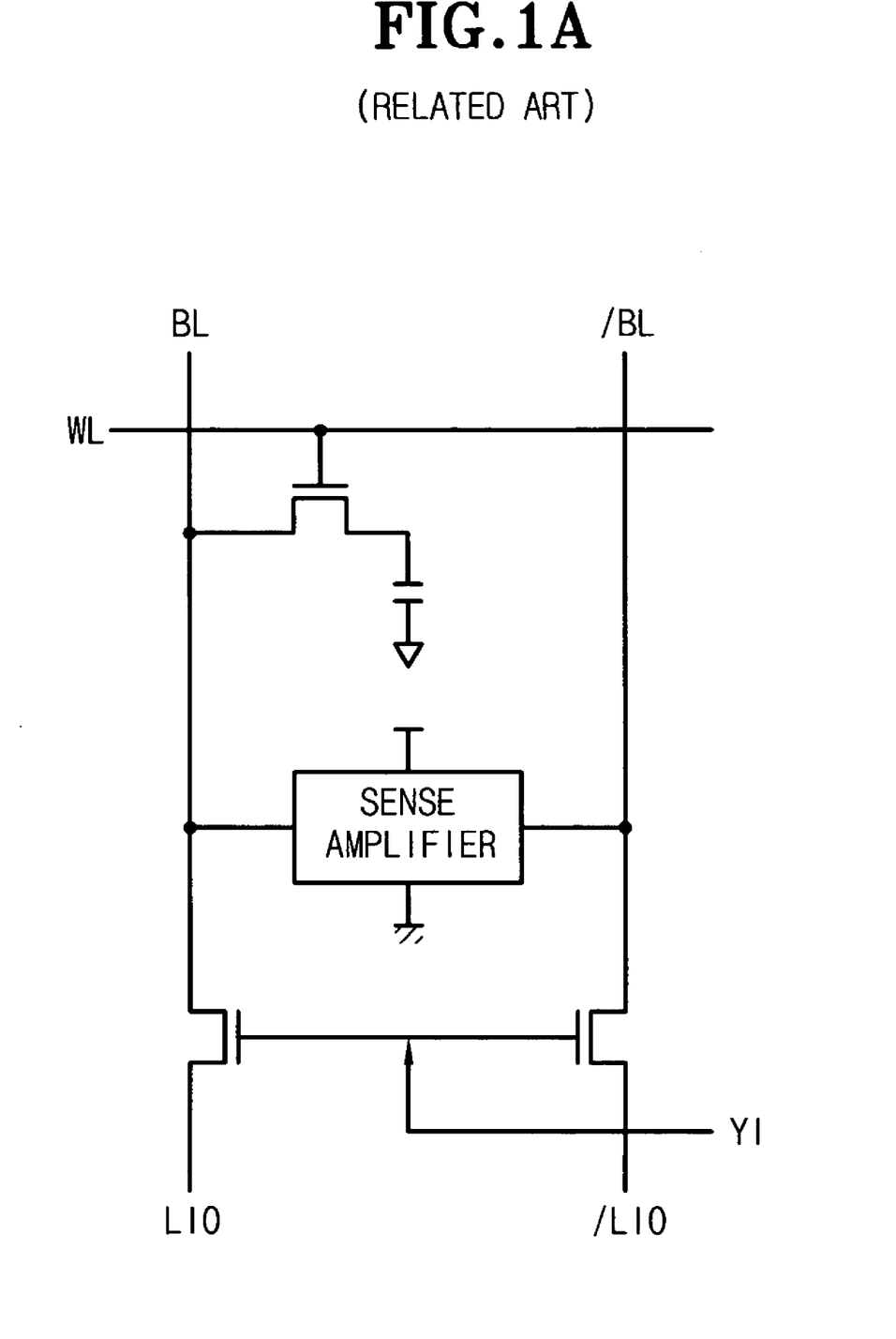
FIG. 1a is a view explaining a memory cell structure.

FIG. 1a is a view illustrating a unit cell, a sense amplifier, a word line WL, bit lines BL and /BL, and local input/output (I/O) lines LIO and /LIO of a conventional memory device. In FIG. 1a, if a column control signal YI is enabled, data on the bit lines BL and /BL are transferred to the local I/O lines LIO and /LIO. For reference, the data transferred to the local I/O lines are transferred to an outside through global I/O lines and an output driver.

Figure 1B:
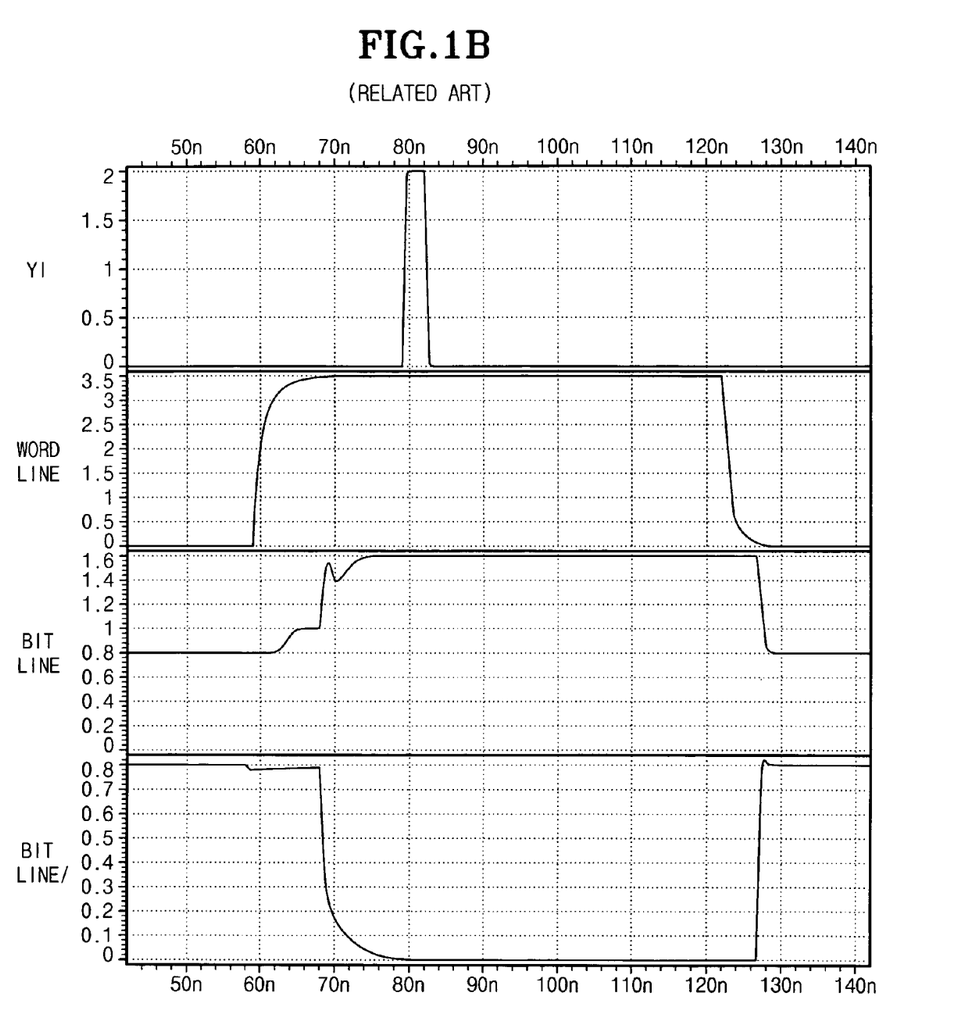

FIG. 1b is a waveform diagram explaining the operation of the circuit of FIG. 1a. As illustrated in FIG. 1b, while the column control signal YI is enabled as a high level, the bit-line data amplified by the sense amplifier would be transferred to the local I/O lines.

Figure 2:
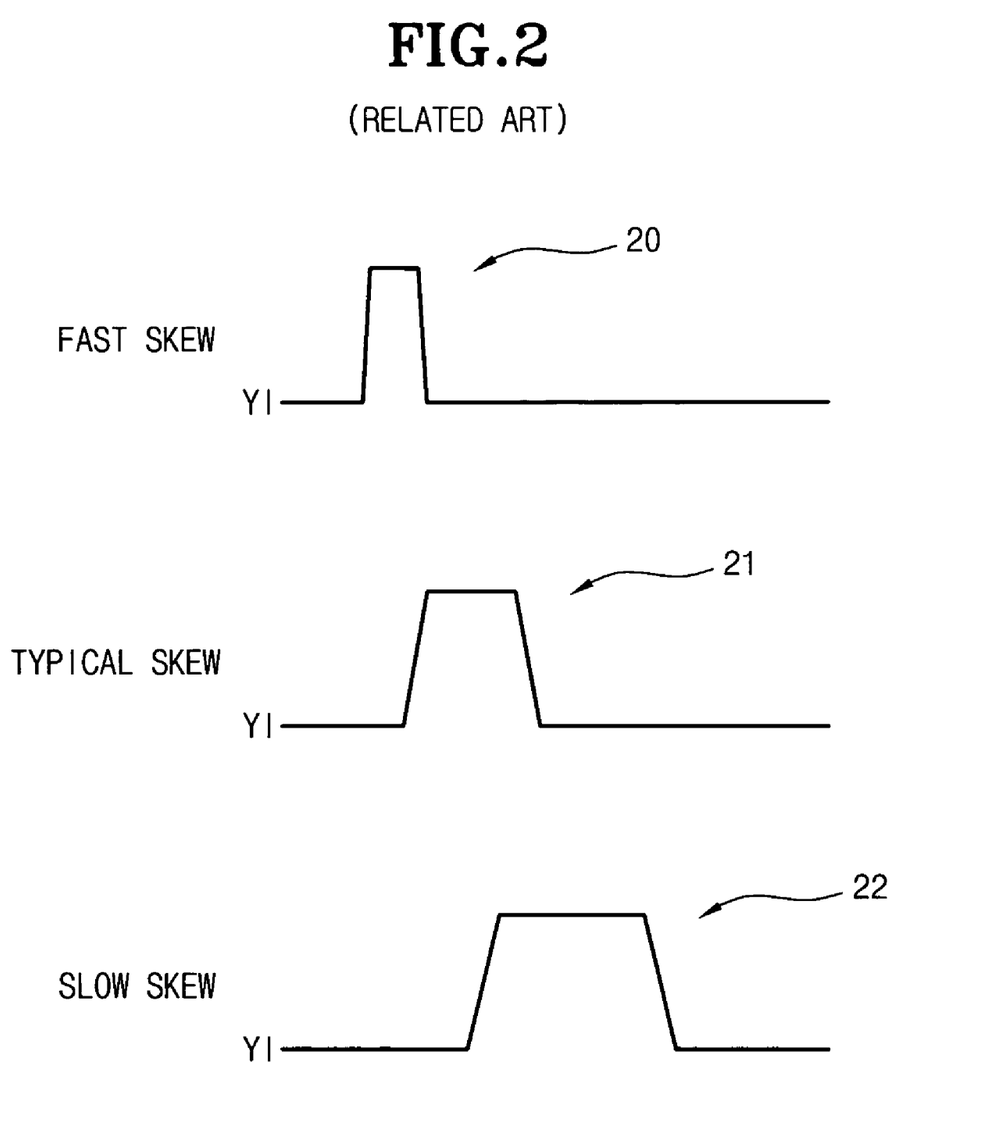
FIG. 2 is a view explaining a process skew.

However, if there is any process variation, the column control signal YI output from a circuit that generates the column control signal may present diverse process skews as shown in FIG. 2.

In FIG. 2, "20" denotes a fast skew of the column control signal YI, "21" denotes a typical skew of the column control signal YI, and "22" denotes a slow skew of the column control signal YI. Here, the fast process skew means that a signal processing speed of an internal control signal generation circuit that generates the column control signal YI is high, and the slow process skew means that the signal processing speed of the internal control signal generation circuit for generating the column control signal YI is low.

Generally, if the pulse width of the column control signal YI is narrow, the bit-line data cannot completely be transferred to the local input/out lines. By contrast, if the pulse width of the column control signal YI is wide, the generation time of the following control signal may be delayed and this may cause the data processing speed to be generally lower. Accordingly, it is preferable that the pulse width of the column control signal YI is kept constant. This may be applied to other internal circuits of the memory device in the same manner.

As described above with reference to FIGS. 1a, 1b and 2, the internal circuits of the memory device include the process skew according to their process variation, and thus a stable operation thereof cannot be secured.

SUMMARY OF THE INVENTION

Accordingly, the present invention has been made to solve the above-mentioned problems occurring in the prior art, and an object of the present invention is to provide a method and apparatus for applying OCD calibration information to an internal circuit of a memory device;

Another object of the present invention is to provide a method and apparatus for correcting a process skew of an internal circuit of a memory device using OCD calibration information.

Still another object of the present invention is to provide a method and apparatus for making the width of a pulse signal output from an internal circuit of a memory device constant irrespective of a process skew.

In a first embodiment of the present invention, there is provided a memory device with an apparatus for recalibrating an output signal of an internal circuit, comprising a plurality of signal modulators for simultaneously receiving the output signal of the internal circuit, and a control unit for outputting a control signal for selecting one of the plurality of signal modulators, wherein the control signal output from the control unit includes OCD (Off Chip Driver) calibration information.

In the first embodiment of the present invention, the OCD calibration information is set information that is obtained from the memory device by an external system and then transmitted to the memory device.

In the first embodiment of the present invention, the output signal of the internal circuit is a pulse signal, and the signal modulators are pulse width modulators for adjusting a pulse width of the pulse signal. Here, the pulse widths of signals output from the respective pulse width modulators are different from one another.

In the first embodiment of the present invention, a driving force of an output driver of the memory device is controlled by the OCD calibration information.

In a second embodiment of the present invention, there is provided a method of recalibrating an output signal of an internal circuit, comprising the steps of obtaining OCD (Off Chip Driver) calibration information of the memory device, selecting one of a plurality of signal modulators that receive the output signal of the internal circuit using the OCD calibration information, and transferring signals output from the signal modulators to other internal circuits.

In the second embodiment of the present invention, the output signal of the internal circuit is a pulse signal, and pulse widths of the modulated signals applied to the other internal circuits are equal to or different from a pulse width of the pulse signal output from the internal circuit.

BRIEF DESCRIPTION OF THE DRAWINGS

The above and other objects, features and advantages of the present invention will be more apparent from the following detailed description taken in conjunction with the accompanying drawings, in which:

FIG. 1b is a waveform diagram explaining the operation of the circuit of FIG. 1a;

DETAILED DESCRIPTION OF THE PREFERRED EMBODIMENTS

Hereinafter, preferred embodiments of the present invention will be described with reference to the accompanying drawings. In the following description and drawings, a detailed description of known functions and configurations incorporated herein will be omitted when it may obscure the subject matter of the present invention.

Figure 3:
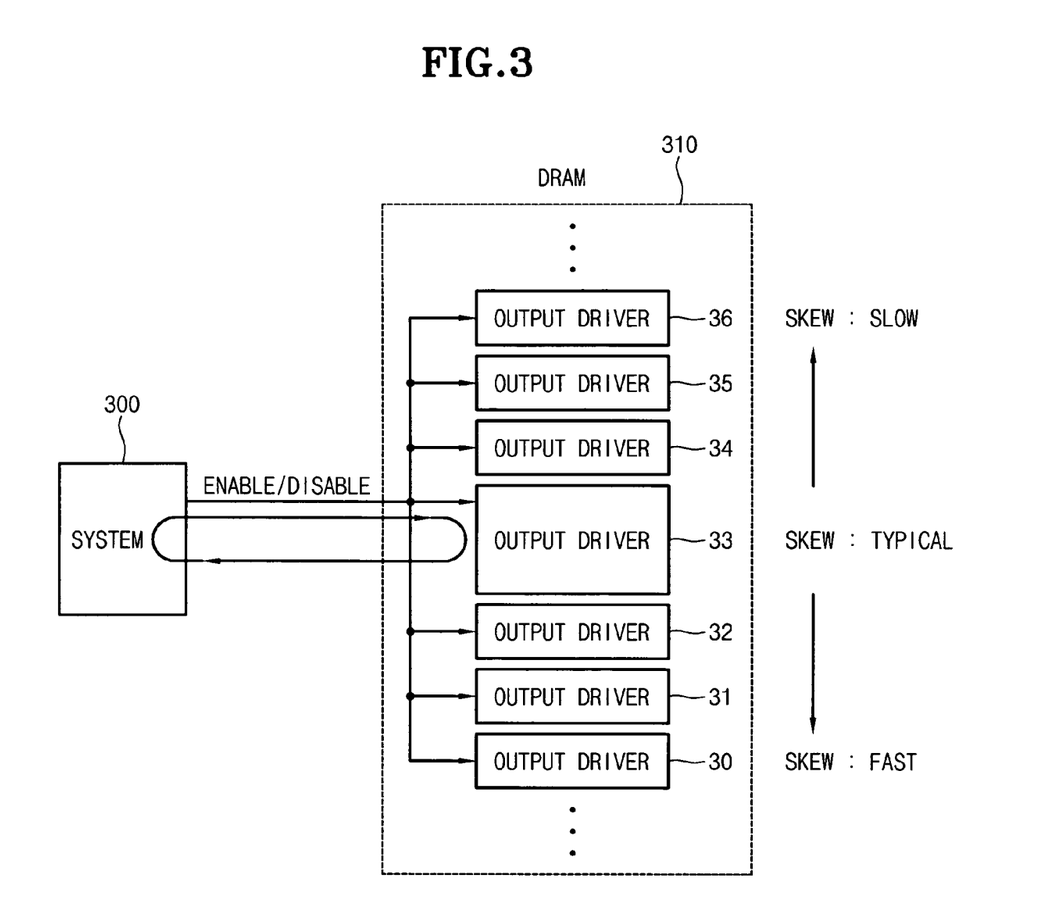
FIG. 3 is a view explaining an OCD calibration of an output driver of a memory device using an external system.

FIG. 3 is a view explaining an OCD calibration of an output driver of a memory device using an external system 300.

If the OCD calibration is performed, the system 300 confirms the state (i.e., the process skew) of the memory device 310, and then decides upon the driving sizes of output drivers 30 to 36.

For example, if the process skew is typical (i.e., normal) as a result of the OCD measurement, the driving capability of the output driver of the memory device would be standard. In this case, it is preferable to determine the number of output drivers being activated as the standard number set at the initial designing stage. For example, in the standard state, only the output drivers 30 to 34 may be activated.

If the process skew is fast as a result of the OCD measurement, the driving capability of the output driver of the memory device would be great. In this case, it is preferable to reduce the number of output drivers being activated. For example, the output drivers 31 to 36 are turned off and only the output driver 30 is turned on and activated, or the output drivers 32 to 36 are turned off and only the output drivers 30 and 31 are turned on and activated. That is, the number of output drivers being activated should be reduced in comparison to the standard state.

Meanwhile, if the process skew is slow as a result of the OCD measurement, the driving capability of the output driver of the memory device would be small. In this case, it is preferable to increase the number of output drivers being activated. For example, the output drivers 35 and 36 are turned off and only the output drivers 30 to 34 are turned on and activated, or the output driver 36 is turned off and only the output drivers 30 to 35 are turned on and activated. That is, the number of output drivers being activated should be increased in comparison to the standard state.

Figure 4:
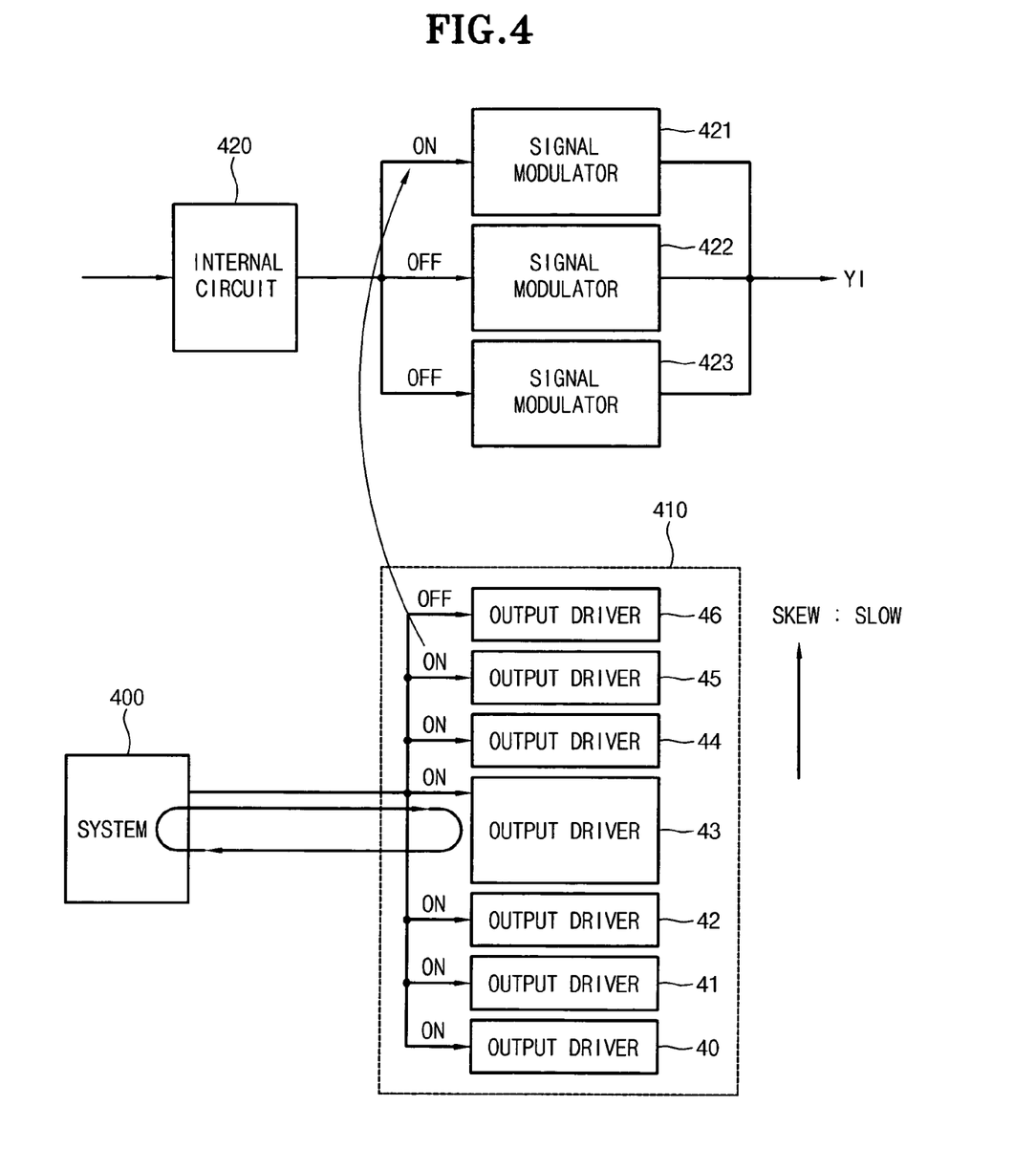
FIGS. 4 and 5 are views explaining recalibration types of an output signal of an internal circuit of a memory device using OCD calibration information.

FIG. 4 is a view explaining a recalibration type of an output signal of an internal circuit of a memory device using OCD calibration information. FIG. 4 illustrates the case in which the process skew of the memory device is slow. In FIG. 4, a system 400, a memory device 410, an internal circuit 42 and signal modulators 421, 422 and 423 are illustrated. The internal circuit 420 means an internal circuit that outputs a signal used in the memory device, and in the present invention, it means a circuit that generates a pulse signal. The signal modulators 421, 422 and 423 receive and modulate the output signal of the internal circuit 420, and in the present invention, they mean pulse width modulators. For reference, the signal modulator 421 is activated when the process skew is slow, the signal modulator 422 is activated when the process skew is normal, and the signal modulator 423 is activated when the process skew is fast.

As can be seen in FIG. 4, since the process skew is slow, the output drivers 40 to 45, the number of which is larger than that in the standard state, are activated, and the output driver 46 is not activated. The OCD calibration information that indicates "process skew is slow" may be stored in the memory device or may directly be applied from the external system 400. Preferably, the OCD calibration information is stored in a latch of the memory device or in a storage unit such as a register.

In the case as illustrated in FIG. 4, only the signal modulator 421 is activated by the OCD calibration information that indicates "process skew is slow." For example, if the width of the pulse signal output from the internal circuit 420 is 5 ns, the pulse width of an internal signal YI output through the signal modulator 421 would be 4 ns.

Figure 5:
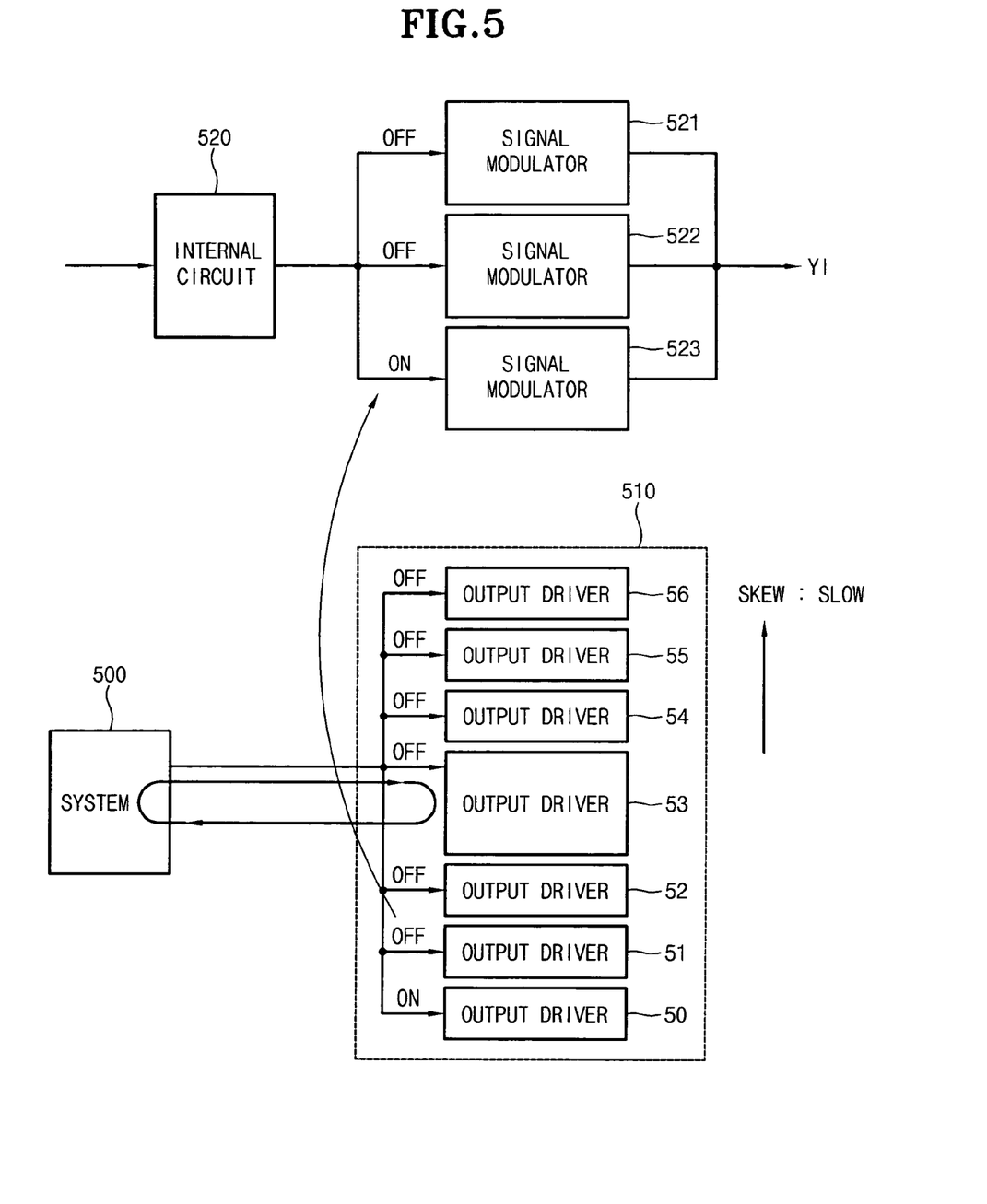

FIG. 5 is a view explaining a recalibration type of an output signal of an internal circuit of a memory device using OCD calibration information. FIG. 5 illustrates the case in which the process skew of the memory device is fast. In FIG. 5, a system 500, a memory device 510, an internal circuit 52 and signal modulators 521, 522 and 523 are the same as those illustrated in FIG. 4. As can be seen in FIG. 5, since the process skew is fast, the output driver 50, the number of which is less than that in the standard state, is activated, and the output driver 51–56 is not activated. The OCD calibration information that indicates "process skew is fast" may be stored in the memory device or may directly be applied from the external system 400. Preferably, the OCD calibration information is stored in a latch of the memory device or in a storage unit such as a register.

In the case as illustrated in FIG. 5, only the signal modulator 523 is activated by the OCD calibration information that indicates "process skew is fast." For example, if the width of the pulse signal output from the internal circuit 520 is 3 ns, the pulse width of an internal signal YI output through the signal modulator 523 would be 4 ns.

If the process skew is normal, being not explained with reference to FIGS. 4 and 5, the signal modulator 422 of FIG. 4 or the signal modulator 522 of FIG. 5 would be selected. In this case, it is preferable that the signal modulator 422 or 522 comprises a delay circuit.

As described above, the modulation types of the output signal of the internal circuit according to the process skew have been explained in detail with reference to FIGS. 4 and 5.

For the convenience in explanation, three signal modulators are illustrated in FIGS. 4 and 5. However, it is also possible to provide four or more signal modulators to achieve a more complete calibration process.

Figure 6:
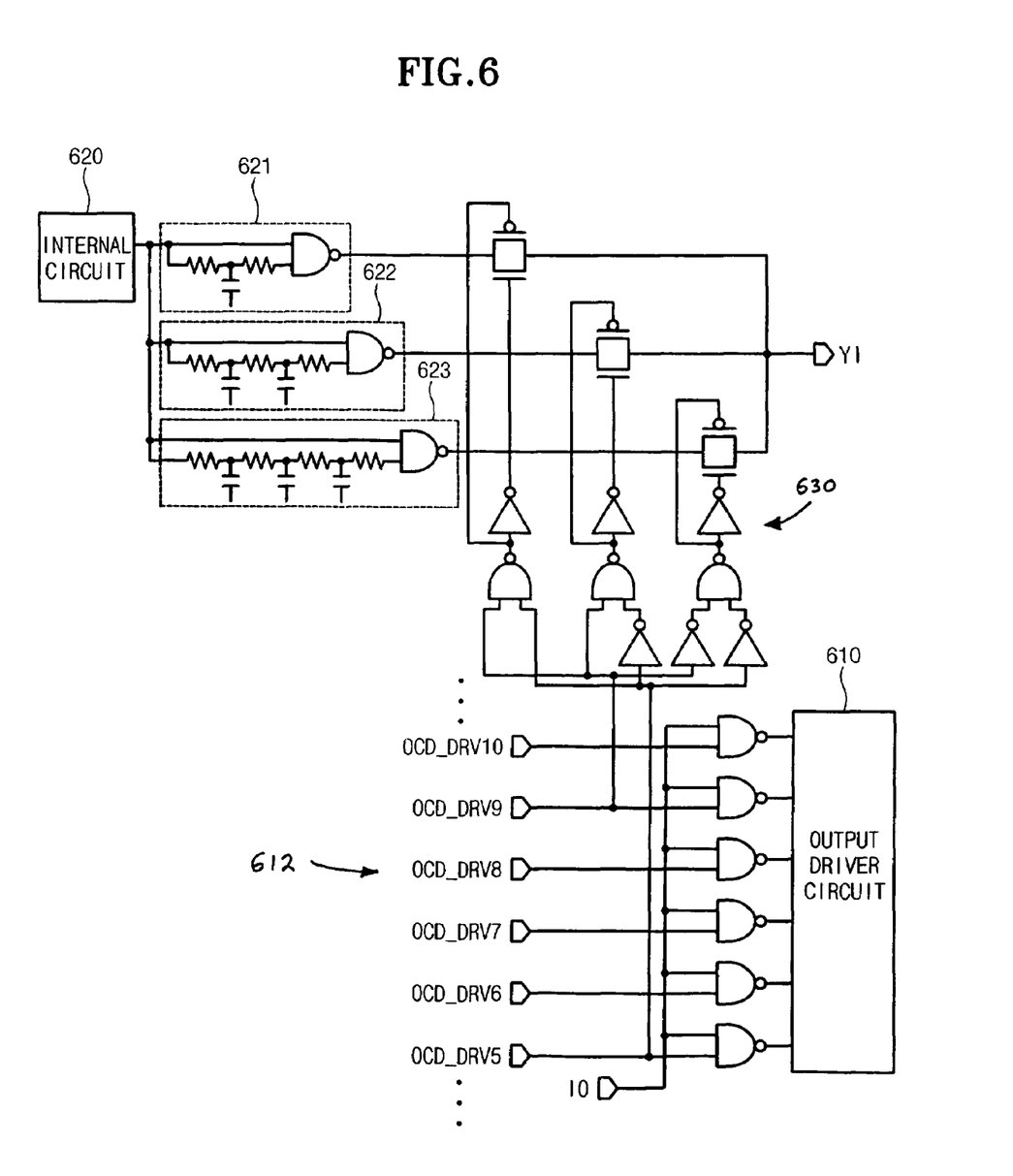
FIG. 6 is a circuit diagram explaining in detail a method of recalibrating an output signal of an internal circuit according to OCD calibration information.

FIG. 6 is a circuit diagram explaining in detail a method of recalibrating an output signal of an internal circuit according to OCD calibration information.

As illustrated in FIG. 6, an output signal of an internal circuit 620 is applied to signal modulators 621 to 623. For reference, although the signal modulators 621 to 623 of FIG. 6 are implemented as pulse width modulators, it is merely exemplary, and other modifications are possible.

In operation, if a specified switch (i.e., a transmission gate) is turned on by the OCD calibration information 612 OCD_DRV5, OCD_DRV6, OCD_DRV7, OCD_DRV8, OCD_DRV9, and OCD_DRV10, one of the signals that has passed through the signal modulators 621 to 623 is outputted to generate the internal signal YI.

In FIG. 6, an output driver circuit 610 is driven by the OCD calibration information, and the number of output drivers being driven is determined by the OCD calibration information initially measured by the external system.

As described above, according to the present invention, since the width of the pulse signal used in the memory device can constantly be calibrated using the OCD calibration information, and thus the characteristic variation of the memory device due to the process skew can be reduced.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A memory device with an apparatus for recalibrating an output signal of an internal circuit, the memory device comprising:
   a plurality of signal modulators for simultaneously receiving the output signal of the internal circuit, wherein the output signal of the internal circuit is a pulse signal, and the signal modulators are pulse width modulators for adjusting a pulse width of the pulse signal; and
   a control unit for outputting a control signal for selecting one of the plurality of signal modulators; wherein the control signal output from the control unit includes OCD (Off Chip Driver) calibration information.

2. The memory device as claimed in claim 1, wherein the OCD calibration information is set information that is obtained from the memory device by an external system and then transmitted to the memory device.

3. The memory device as claimed in claim 1, wherein the pulse widths of signals output from the respective pulse width modulators are different from one another.

4. The memory device as claimed in claim 1, wherein a driving force of an output driver of the memory device is controlled by the OCD calibration information.

5. A method of recalibrating an output signal of an internal circuit, the method comprising the steps of:
   obtaining OCD (Off Chip Driver) calibration information of the memory device;
   selecting one of a plurality of signal modulators that receive the output signal of the internal circuit using the OCD calibration information, wherein the output signal of the internal circuit is a pulse signal, and the signal modulators are pulse width modulators for adjusting a pulse width of the pulse signal; and
   transferring signals output from the signal modulators to other internal circuits.

6. The method as claimed in claim 5, wherein the pulse widths of the modulated signals applied to the other internal circuits are equal to or different from a pulse width of the pulse signal output from the internal circuit.

* * * * *